US011038731B2

(12) United States Patent
Fomin et al.

(10) Patent No.: US 11,038,731 B2
(45) Date of Patent: Jun. 15, 2021

(54) CREST FACTOR REDUCTION

(71) Applicant: NanoSemi, Inc, Waltham, MA (US)

(72) Inventors: Dmitri Fomin, Hopkinton, MA (US);
Alexandre Megretski, Concord, MA (US); Kevin Chuang, Cambridge, MA (US); Zohaib Mahmood, Westwood, MA (US); Yan Li, Lexington, MA (US); Helen H. Kim, Sudbury, MA (US); George Stone, Hollis, NH (US)

(73) Assignee: NanoSemi, Inc., Waltham, MA (US)

( * ) Notice: Subject to any disclaimer, the term of this patent is extended or adjusted under 35 U.S.C. 154(b) by 0 days.

(21) Appl. No.: 16/620,725

(22) PCT Filed: Jun. 8, 2018

(86) PCT No.: PCT/US2018/036691
§ 371 (c)(1),
(2) Date: Dec. 9, 2019

(87) PCT Pub. No.: WO2018/227111
PCT Pub. Date: Dec. 13, 2018

(65) Prior Publication Data
US 2020/0204418 A1 Jun. 25, 2020

Related U.S. Application Data

(60) Provisional application No. 62/517,348, filed on Jun. 9, 2017.

(51) Int. Cl.
*H04L 27/26* (2006.01)
*H04L 25/03* (2006.01)
(52) U.S. Cl.
CPC .... *H04L 27/2614* (2013.01); *H04L 25/03834* (2013.01)

(58) Field of Classification Search
CPC .................... H04L 27/2614; H04L 25/03834
See application file for complete search history.

(56) References Cited

U.S. PATENT DOCUMENTS 6,879,642 B2   4/2005   Taskinen
7,643,801 B2   1/2010   Piirainen
(Continued)

FOREIGN PATENT DOCUMENTS

CN       109347779 A       2/2019

OTHER PUBLICATIONS

Nakamura, T., Kimura, S., Saito, M., Okada, M. (2019), "A Novel Low Complexity Clipping Method for OFDM Signals".
(Continued)

*Primary Examiner* — Sung S Ahn
(74) *Attorney, Agent, or Firm* — Occhiuti & Rohlicek LLP

(57) ABSTRACT

Disclosed are crest factor reduction (CFR) implementations that include a method comprising getting communication system data representative of characteristics of a communication system comprising one or more radio transmission bands, and optimizing, based at least in part on the input communication system data, a plurality of updateable parameters that determine respective pulse shapes for one or more pulses as well as other certain algorithm execution parameters for use in the CFR system. Optimizing the plurality of updateable parameters includes iteratively updating the plurality of updateable parameters based on iterative evaluation of a plurality of performance parameters. The method further includes providing the optimized plurality of updateable parameters to configure the crest reduction system for use in processing signals for radio
(Continued)

transmission using a pulse subtraction approach applied to one or more signals communicated through the communication system.

28 Claims, 7 Drawing Sheets

(56) References Cited

U.S. PATENT DOCUMENTS

| | | | |
|---|---|---|---|
| 7,839,951 | B2 | 11/2010 | Cai et al. |
| 8,457,249 | B2 * | 6/2013 | Gotman ............ H04L 27/2624 375/297 |
| 8,619,903 | B2 | 12/2013 | Schmidt et al. |
| 9,014,319 | B1 | 4/2015 | Copeland |
| 9,313,078 | B1 | 4/2016 | Barman et al. |
| 2002/0107673 | A1 | 8/2002 | Haller et al. |
| 2004/0076247 | A1 | 4/2004 | Barak et al. |
| 2006/0154622 | A1 | 7/2006 | Piirainen |
| 2008/0019453 | A1 | 1/2008 | Zhao et al. |
| 2008/0101502 | A1 | 5/2008 | Navidpour et al. |
| 2008/0247487 | A1 | 10/2008 | Cai et al. |
| 2010/0042956 | A1 | 2/2010 | Lan |
| 2012/0093209 | A1 | 4/2012 | Schmidt et al. |
| 2012/0093210 | A1 * | 4/2012 | Schmidt ............ H04L 27/2624 375/224 |
| 2014/0269984 | A1 | 9/2014 | Piazzi et al. |
| 2017/0026216 | A1 | 1/2017 | Zhao |
| 2018/0359126 | A1 | 12/2018 | Wang |

OTHER PUBLICATIONS

Andraka, R. (1998), "A survey of CORDIC algorithms for FPGA based computers", Proceedings of the 1998 ACM/SIGDA sixth international symposium on Field Programmable Gate Arrays, pp. 191-200.

Hill, G., Faulkner, M. (2002), "Comparison of low complexity clipping algorithms for OFDM", Proc. 13th IEEE International Symposium on Personal Indoor and Mobile Radio Communications (PIMRC) 2002.

Lakshmi, B., Dhar, A.S. (2009), "CORDIC Architectures: A Survey," VLSI Design, vol. 2010.

International Search Report dated Sep. 18, 2018 in International Application No. PCT/US2018/036691.

* cited by examiner

CREST FACTOR REDUCTION

CROSS-REFERENCE TO RELATED APPLICATIONS

This application is a national phase under 35 USC 371 of international application no. PCT/US2018/036691, filed Jun. 8, 2018, which claims the benefit of U.S. Provisional Application No. 62/517,348, filed Jun. 9, 2017, the contents of which are incorporated by reference.

BACKGROUND

The present disclosure relates to crest factor reduction.

In many communication systems, it desirable that the peak amplitude of a signal be limited relative to an average, for example, relative to an average root-mean-square (RMS) or average absolute magnitude. An amplification component for a radio frequency power amplifier, for example, may have an absolute limit on its output amplitude or exhibit substantial distortion beyond a certain output amplitude, and therefore to avoid introducing distortion resulting from such a limit (e.g., "clipping") it is desirable to preprocess the signal so that the input signal does not cause distortion in the output. It is also desirable to preprocess the signal in such a way to avoid introducing various forms of distortion into the signal, and to perform the preprocessing within a prescribed computation budget.

SUMMARY

In a general aspect, an approach to crest factor reduction (CFR) processing makes use of subtraction of scaled pulses (or other application of the pulses) from an input signal or from baseband signals of multiple bands. The pulses are pre-designed according to specific requirements that are to be met by the CFR approach in the context of the communication bands and encoding approaches. The available computation and storage capacity of systems implementing the CFR approach may also be taken into account in designing the pulse shapes. The pre-designing process uses a quantitative evaluation and optimization of various pulse shapes to yield the pulse shape(s) for use in the runtime CFR signal processing.

One or more of these approaches address the technical problem of limiting the peak amplitude while minimizing or reducing distortion, for example, quantified in terms of the resulting Error Vector Magnitude (EVM) and Adjacent Chanel Power Ratio (ACPR) quantities. By reducing EVM, the effective communication data rate within the band may be increased relative to existing approaches. By reducing ACPR, interference in adjacent channels is reduced, which may increase the communication data rates in such channels because of the reduced interference.

In some variations, a method is provided that includes receiving communication system data representative of characteristics of a communication system comprising one or more radio transmission bands, and optimizing, based at least in part on the received communication system data, a plurality of updateable parameters that determine respective pulse shapes for one or more pulses for use in a crest factor reduction system. Optimizing the plurality of updateable parameters includes iteratively updating the plurality of updateable parameters based on iterative evaluation of a plurality of performance parameters. The method further includes providing the optimized plurality of updateable parameters that determine the respective pulse shapes for the one or more pulses to configure the crest reduction system for use in processing signals for radio transmission using a pulse subtraction approach applied to one or more signals communicated through the communication system.

Embodiments of the method may include at least some of the features described in the present disclosure, including one or more of the following features.

Optimizing the plurality of the updateable parameters may include optimizing one or more of, for example, a pulse shape factor to control signal smoothing level, a band stretch ratio, a band relative weight factor to control distribution of a compensation scale factor between the one or more radio transmission bands, a hard clipping factor, and/or a qualification window size value representative of a smallest time separation between cancelled peaks.

Receiving the communication system data may include receiving one or more of, for example, an adjacent power value ratio (ACPR), an up-sampling value, a sampling rate, carrier configuration data, a pulse shape factor value, a band stretch ratio, at least one pulse band weight, a hard-clipping factor, a pulse length value, a number of peak trackers, a number of crest factor reduction stages, or a qualification window size value representative of a smallest time separation between cancelled peaks.

Iteratively updating the plurality of updateable parameters based on the iterative evaluation of the plurality of performance parameters may include defining at least one objective function representative of quality of the respective pulse shapes for the one or more pulses, determining one or more starting-point pulse shapes for the one or more pulses based on the received communication system data and starting point values for the plurality of updateable parameters, and iteratively updating the plurality of updateable parameters based on iterative computation of the at least one objective function to provide at least one interim output value derived from application of the crest factor reduction system on a sample input signal using interim one or more pulse shapes, with the interim one or more pulse shapes determined based on the received communication system data and interim updated values for the plurality of updateable parameters.

Defining the at least one objective function may include defining an objective function comprising a linear combination of an error vector magnitude (EVM) and an adjacent channel power ratio (ACPR) according to: EVM+$\gamma$(ACPR−ACPR$_{target}$)×ACPR, where $\gamma$ is a barrier weight function $\gamma(t)$ computed according to $\gamma(t)=k_1 \times t$ if $t>0$ or $\gamma(t)=k_2 \times t$ if $t<0$, where $k_1$ and $k_2$ are adjustable coefficients, and where ACPR$_{target}$ is representative of a pre-determined target ACPR value.

The method may further include configuring the crest factor reduction system with the optimized values, and processing received signals for transmission using the crest factor reduction system.

Processing the received signals may include performing pulse subtraction processing on the received signals using the respective one or more pulse shapes determined, at least in part, based on the optimized plurality of updateable parameters.

Performing the pulse subtraction processing on the received signals may include identifying a peak in an aggregate time-domain signal combined from one or more time-domain representations of the received signals in the one or more radio transmission bands, and performing, using the respective determined pulse shapes for the one or more pulses, individual pulse subtraction processing for the respective one or more time-domain representations of the respective received signals at instances of the received signals determined based, at least in part, on a location in the aggregate time-domain signal of the identified peak.

Performing the individual pulse subtraction processing may include weighing the respective one or more pulse shapes based on characteristics of the received signals in the one or more bands.

The characteristics of the received signals may include at least relative signal power of the received signals.

In some variations, a system is provided that includes an interface to receive communication system data representative of characteristics of a communication system comprising one or more radio transmission bands, and an optimization engine configured to optimize, based at least in part on the received communication system data, a plurality of updateable parameters that determine respective pulse shapes for one or more pulses for use in a crest factor reduction system. Optimizing the plurality of updateable parameters includes iteratively updating the plurality of updateable parameters based on iterative evaluation of a plurality of performance parameters. The system further includes a communication module to provide the optimized plurality of updateable parameters that determine the respective pulse shapes for the one or more pulses to configure the crest factor reduction system for use in processing signals for radio transmission using a pulse subtraction approach applied to one or more signals communicated through the communication system.

Embodiments of the system may include at least some of the features described in the present disclosure, including at least some of the features described above in relation to the method, as well as one or more of the following features.

The optimizer configured to optimize the plurality of the updateable parameters may be configured to optimize one or more of, for example, a pulse shape factor to control signal smoothing level, a band stretch ratio, a band relative weight factor to control distribution of a compensation scale factor between the one or more radio transmission bands, a hard clipping factor, and/or a qualification window size value representative of a smallest time separation between cancelled peaks.

The optimizer configured to iteratively update the plurality of updateable parameters based on the iterative evaluation of the plurality of performance parameters may be configured to define at least one objective function representative of quality of the respective pulse shapes for the one or more pulses, determine one or more starting-point pulse shapes for the one or more pulses based on the received communication system data and starting point values for the plurality of updateable parameters, and iteratively update the plurality of updateable parameters based on iterative computation of the at least one objective function to provide at least one interim output value derived from application of the crest factor reduction system on a sample input signal using interim one or more pulse shapes, with the interim one or more pulse shapes determined, based on the received communication system data and interim updated values for the plurality of updateable parameters.

The optimizer configured to define the at least one objective function may be configured to define an objective function comprising a linear combination of an error vector magnitude (EVM) and an adjacent channel power ratio (ACPR) according to: $EVM + \gamma(ACPR - ACPR_{target}) \times ACPR$, where $\gamma$ is a barrier weight function $\gamma(t)$ computed according to $\gamma(t) = k_1 \times t$ if $t > 0$ or $\gamma(t) = k_2 \times t$ if $t < 0$, where $k_1$ and $k_2$ are adjustable coefficients and where $ACPR_{target}$ is representative of a pre-determined target ACPR value.

The system may further configure the crest reduction system with the optimized values, and process received signals for transmission using the crest factor reduction system.

In some variations, a method for signal processing in a crest factor reduction system is provided. The method includes identifying a peak in an aggregate time-domain signal combined from one or more time-domain representations of received signals in one or more radio transmission bands, and performing, using respective pulse shapes for one or more pulses, determined based on optimization of a plurality of updateable parameters, individual pulse subtraction processing for the respective one or more time-domain representations of the respective received signals at instances of the received signals determined based, at least in part, on a location in the aggregate time-domain signal of the identified peak. The optimization of the plurality of updateable parameters is based on an earlier performance of iterative updating of the plurality of updateable parameters according to an iterative evaluation of a plurality of performance parameters using, at least in part, pre-determined communication system data representative of characteristics of a communication system comprising the one or more radio transmission bands.

Embodiments of the method may include at least some of the features described in the present disclosure, including at least some of the features described above in relation to the first method and the system, as well as one or more of the following features.

Performing the individual pulse subtraction processing may include weighing the respective one or more pulse shapes based on characteristics of the received signals in the one or more radio transmission bands.

The characteristics of the received signals may include at least relative signal power of the received signals.

The optimization of the plurality of updateable parameters may include optimization of one or more of, for example, a pulse shape factor to control signal smoothing level, a band stretch ratio, a band relative weight factor to control distribution of a compensation scale factor between the one or more radio transmission bands, a hard clipping factor, and/or a qualification window size value representative of a smallest time separation between cancelled peaks.

The communication system data may include one or more of, for example, an adjacent channel power ratio (ACPR), an up-sampling value, a sampling rate, carrier configuration setting, a pulse shape factor, a band stretch ratio, at least one pulse band weight, a hard-clipping factor, a pulse length, a number of peak trackers, a number of crest factor reduction stages, and/or a qualification window size, representative of a smallest time separation between cancelled peaks.

The iterative updating of the plurality of updateable parameters according to the iterative evaluation of the plurality of performance parameters may be performed using at least one objective function representative of quality of the respective pulse shapes for the one or more pulses and iterative updating of the plurality of updateable parameters according to iterative computation of the at least one objective function to provide at least one interim output value derived from application of the crest factor reduction system on a sample input signal using interim one or more pulse shapes, with the interim one or more pulse shapes determined based on the communication system data and interim updated values for the plurality of updateable parameters.

At least one objective function may include a linear combination of an error vector magnitude (EVM) and an adjacent channel power ratio (ACPR) according to: EVM+

$\gamma(ACPR-ACPR_{target}) \times ACPR$, where $\gamma$ is a barrier weight function $\gamma(t)$ computed according to $\gamma(t)=k_1 \times t$ if $t>0$ or $\gamma(t)=k_2 \times t$ if $t<0$, where $k_1$ and $k_2$ are adjustable coefficients, and where $ACPR_{target}$ is representative of a pre-determined target ACPR value.

In some variations, a crest factor reduction system is provided that includes a peak identification circuit to identify a peak in an aggregate time-domain signal combined from one or more time-domain representations of received signals in one or more radio transmission bands, and a pulse subtraction circuit to perform, using respective pulse shapes for one or more pulses, determined based on optimization of a plurality of updateable parameters, individual pulse subtraction processing for the respective one or more time-domain representations of the respective received signals at instances of the received signals determined based, at least in part, on a location in the aggregate time-domain signal of the identified peak. The optimization of the plurality of updateable parameters is based on an earlier performance of iterative updating of the plurality of updateable parameters according to an iterative evaluation of a plurality of performance parameters using, at least in part, pre-determined communication system data representative of characteristics of a communication system comprising the one or more radio transmission bands.

Embodiments of the crest factor reduction system may include at least some of the features described in the present disclosure, including at least some of the features described above in relation to the first and second methods, and the first system, as well as one or more of the following features.

The circuit subtraction circuit to perform the individual pulse subtraction may be configured to weigh the respective one or more pulse shapes based on characteristics of the received signals in the one or more radio transmission bands.

The characteristics of the received signals may include at least relative signal power of the received signals.

The optimization of the plurality of updateable parameters may include optimization of one or more of, for example, a pulse shape factor to control signal smoothing level, a band stretch ratio, a band relative weight factor to control distribution of a compensation scale factor between the one or more radio transmission bands, a hard clipping factor, and/or a qualification window size value representative of a smallest time separation between cancelled peaks.

In some variations, a crest factor reduction system is provided that is configured to perform one or more of the method steps provided above.

In some variations, a design structure is provided that is encoded on a non-transitory machine-readable medium, with the design structure including elements that, when processed in a computer-aided design system, generate a machine-executable representation of one or more of the system modules described above.

In some variations, an integrated circuit definition dataset that, when processed in an integrated circuit manufacturing system, configures the integrated circuit manufacturing system to manufacture one or more of the system modules described above.

In some variations, a non-transitory computer readable media is provided that is programmed with a set of computer instructions executable on a processor that, when executed, cause the operations comprising the various method steps described above.

Embodiments of the crest factor reduction system, the design structure, the integrated circuit definition dataset, and the computer-readable media may include at least some of the features described in the present disclosure, including at least some of the features described above in relation to the first and second methods, and the first and second systems.

Other features and advantages of the invention are apparent from the following description, and from the claims.

BRIEF DESCRIPTION OF THE DRAWINGS

These and other aspects will now be described in detail with reference to the following drawings.

Like reference symbols in the various drawings indicate like elements.

DESCRIPTION

Figure 1:
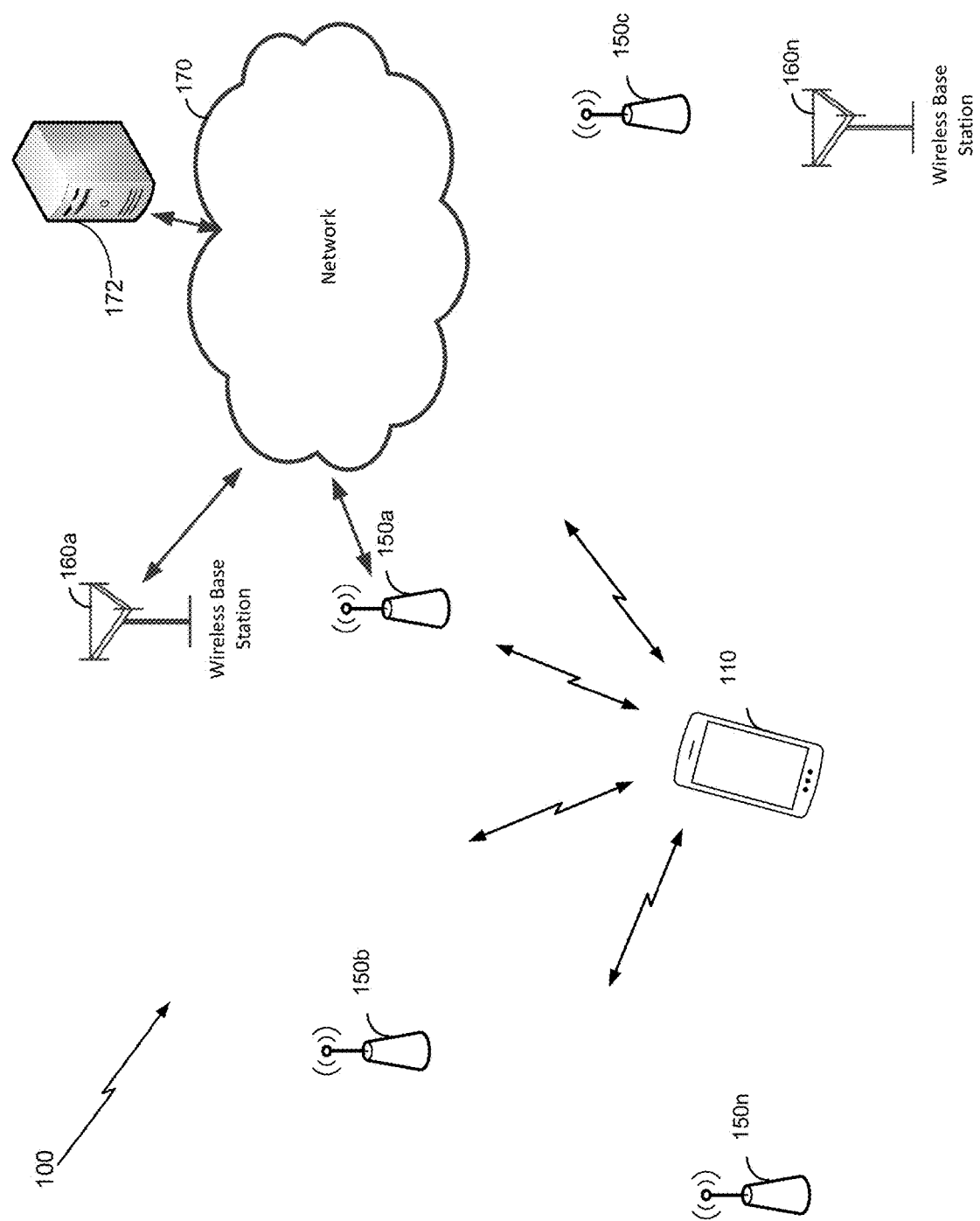
FIG. 1 is a diagram of an example communication system with multiple devices that each (or some of which) may be configured to implement a crest factor reduction system.

Disclosed herein are methods, systems, devices, media, and other implementations, for determining optimal, or near-optimal ("optimized" but not necessarily "optimal"), pulse shapes to apply to signals in one or more radio transmission bands to achieve optimal, or near-optimal, crest factor reduction (CFR). In this type of preprocessing, the "crest factor" may be defined as a ratio of a peak value to the average RMS value of a signal waveform. In the present disclosure, the following terminology will be used. The quantity "peak-to-average power ratio" (PAPR) is defined as the peak amplitude squared (giving the peak power) divided by the RMS value squared (giving the average power), so PAPR is equal to the square of Crest Factor (CF). However, when expressed in a logarithmic scale (decibels or dB) PAPR value is the same as CF. Various measures of distortion may characterize the effect of the preprocessing. For example, an error vector magnitude (EVM) may be defined as the square root of the mean error power divided by the square root of a reference power (e.g., the maximum power of the coding constellation), expressed in decibels or as a percentage. Another measure of distortion relates to a spreading of signal energy outside the desired signal band, for example, measured as an "adjacent channel power ratio" (ACPR) and defined as a ratio between the total power in adjacent channels (e.g., an intermodulation signal) to the desired channel's power.

A variety of approaches may be used for CFR. One approach involves upsampling and then clipping the signal, followed by filtering the clipped signal to reduce distortion, primarily in the form a ACPR. Because the filtering may itself introduce new amplitude peaks, this process may be repeated multiple times. In some such approaches, the level at which the signal is clipped may be reduced from stage to stage to progressively meet the target maximum amplitude relative to the RMS value. In another approach, the upsampled signal is clipped, and the amount by which this signal exceeds the clipping signal is filtered by a predefined filter or multiplied by a predefined time-domain window centered at a time location of the peak amplitude (i.e., so that is appropriately band limited), and subtracted from the signal. Again, in such an approach, the process may be repeated in several stages because the filtering or windowing may introduce new peak amplitudes beyond the limit.

Yet another approach identifies locations of peak amplitude above a threshold in the input signal, and subtracts scaled versions of a predefined pulse shape. This pulse shape may be designed so that it does not add substantial energy outside the permitted signal band. Because the subtracted pulse may not remove peak amplitudes near but not at the point the pulse is added, this process may need to be repeated multiple times.

In some systems, the input signal may represent a combination of signals in two or more frequency limited bands that are separated in frequency with intervening bands. Some of the approaches described herein attempt to process baseband signals representing each of the limited frequency bands with the goal of limiting the amplitude of the combined signal.

Accordingly, in some embodiments, a method is provided that includes receiving communication system data representative of characteristics of a communication system comprising one or more radio transmission bands, and optimizing, based at least in part on the received communication system data, a plurality of updateable parameters that determine respective pulse shapes for one or more pulses for use in a crest factor reduction system, with optimizing the plurality of updateable parameters including iteratively updating the plurality of updateable parameters based on iterative evaluation of a plurality of performance parameters. By "optimizing" values we mean determining the values to yield an improved or the best objective, for instance, optimizing the values of the shape parameters to yield improved or best performance as quantified via the performance parameters. The method also includes providing the optimized plurality of updateable parameters that determine the respective pulse shapes for the one or more pulses to configure the crest reduction system for use in processing signals for radio transmission using a pulse subtraction approach applied to one or more signals communicated through the communication system.

The method may further include configuring the crest reduction system (which may be implemented at a network node, such as a base station or access point, or at a personal device) with the optimized values, and processing received signals for transmission using the crest factor reduction system. The crest factor reduction system may be at the device in which the CFR system design was performed, or at some other device. Processing the received signals may include performing pulse subtraction processing on the received signals using the respective one or more pulse shapes determined, at least in part, based on the optimized plurality of updateable parameters. Performing the pulse subtraction on the received signals may include identifying a peak in an aggregate time-domain signal (or, in some embodiments, a spatial-domain signal) combined from one or more time-domain representations of the received signals in the one or more radio transmission bands, and performing, subtraction of individual pulses for the respective one or more time-domain representations of the respective received signals at instances of the received signals determined based, at least in part, on a location in the aggregate time-domain signal of the identified peak.

In some embodiments, a device (such as a personal device 110, a server 172, and/or network nodes such as access points 150a-n and base stations 160a-n, that are depicted in an example communication system 100 of FIG. 1; the devices 110, 150a-n, and 160a-n can communicate with the server 172 via a network 170) may be configured to implement a CFR system based on a design optimized at another (remote) device. Such embodiments may thus include a method, to implement a CFR system, comprising identifying a peak in an aggregate time-domain signal combined from one or more time-domain representations of received signals in one or more radio transmission bands, and individual pulse subtraction for the respective one or more time-domain representations of the respective received signals at instances of the received signals determined based, at least in part, on a location in the aggregate time-domain signal of the identified peak. The optimization of the plurality of updateable parameters is based on an earlier performance of iterative updating of the plurality of updateable parameters according to an iterative evaluation of a plurality of performance parameters using, at least in part, pre-determined communication system data representative of characteristics of a communication system comprising the one or more radio transmission bands.

As noted, a CFR system implementation includes two main stages: 1) the CFR development/design stage in which a crest factor reduction system design process is performed for a single band or a multi-band configuration based on pre-determined or specified communication system data (e.g., data representative of attributes of the communication system, such as the example system 100, including data representative of some of the CFR pulse shape attributes and/or optimization settings), and 2) CFR implementation stage, in which the implementation developed in the first stage is deployed to, or realized at (e.g., on processor-based devices, FPGA/ASIC-based device) various devices/nodes of the system, and applied to single or multi-band signals.

Figure 2:
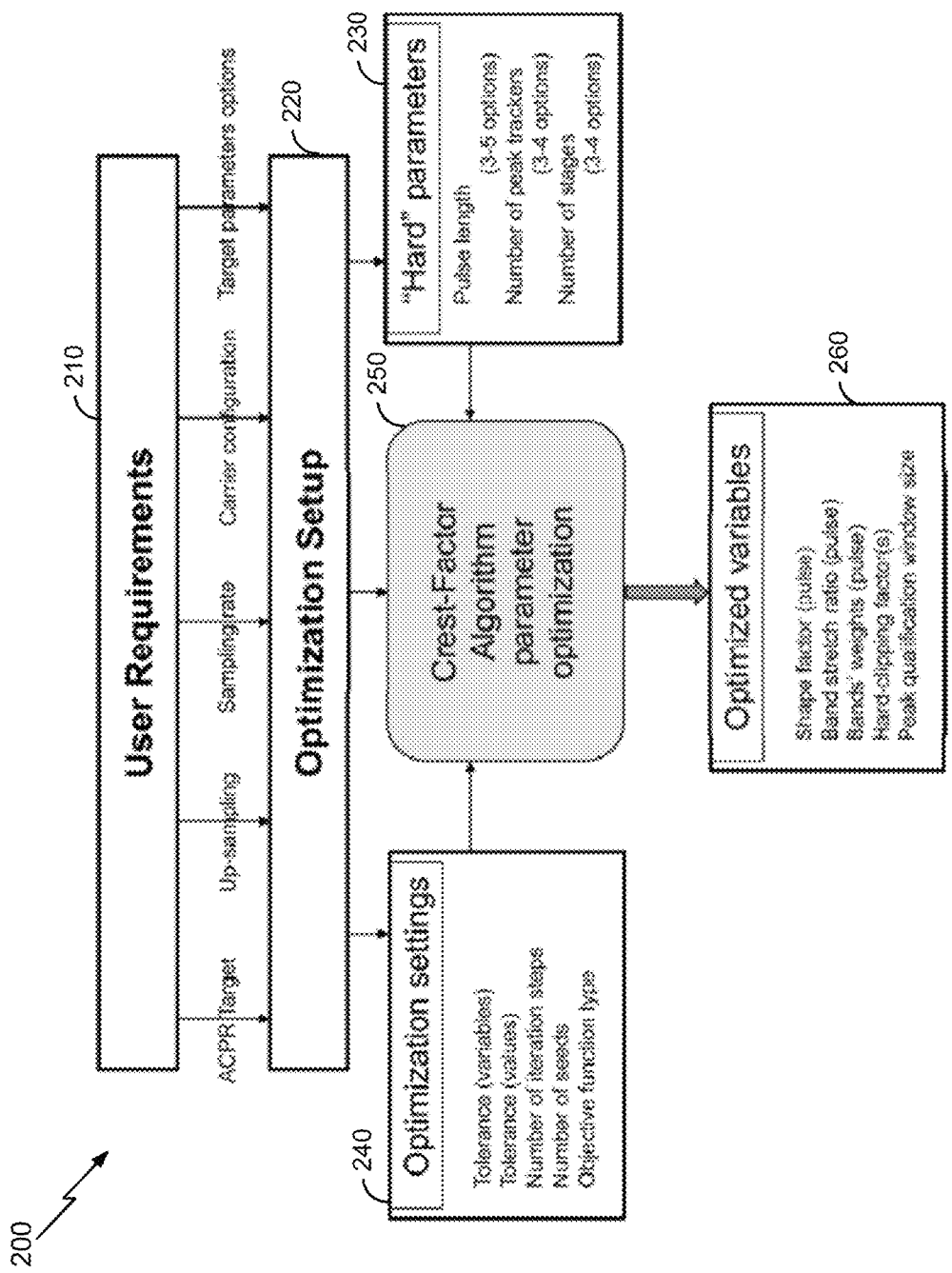
FIG. 2 is a flow diagram of a process to determine/develop a crest factor reduction system.

Thus, with reference to FIG. 2, a flow diagram illustrating a process 200, which may be implemented at any of the devices/nodes depicted in FIG. 1, to determine/develop a crest factor reduction system is provided. In some implementations, a design-time-system includes a user-interface (e.g., a graphical user interface, GUI, which includes an interface such as the one shown in FIG. 3) in which a user specifies various aspects, parameters, or attributes of the communication system in which a pulse-subtraction-based crest factor reduction (CFR) approach may be used. For example, and as illustrated in a user-requirements stage 210 of the process 200, a user (e.g., a technician, engineer, or administrator of the devices/nodes of FIG. 1, a user of, for example, the mobile wireless device 110, etc.) may specify (or such data may be otherwise obtained from data repositories and databases) characteristics of the communication system that affect communication aspects of the wireless transmissions and signal processing performed by the communication system. The stage 210 may be implemented as an interface between a user and a device/engine (e.g., a device or engine to optimize the parameters controlling pulse shapes), or as a device-to-device interface (where one device requests pertinent information from another device, and the other device can provide that information). Such an interface, implemented for the stage 210, can be used to specify aspects/parameters/attributes of the communication system used may include one or more of the following:

ACPR target or maximum level;
sampling rate and the up-sampling factor for the input signal (or signals in a multiband configuration);

carrier configuration, including width and location of the communication bands, and the coding approach used within the bands.

The interface implemented for the stage 210 can thus provide the data specified by the user, or provided by a remote device or node, to the optimization setup stage 220. The optimization setup stage 220 computes the optimized variables such as Shape factor, Band stretch ratio, Bands weights, Hard-clipping factor(s) and peak qualification window size. The user may also specify (or, alternatively, the information may be provided by a remote device), at a hard parameter stage 230 certain aspects of the pulses and the CFR approach itself, to be realized for the communication system, including one or more of the following:

pulse length;
Number of peak trackers;
number of CFR stages;
hard clipping factor(s), for example representing the amount of crest factor reduction in each of a series of stages;
peak qualification window size, which determines the smallest time separation of peaks that are cancelled (i.e., only the largest peak in the qualification window size may be explicitly cancelled).

For each of the above-indicated CFR design parameters, the user may select from 3-5 options, or may select any value within some pre-determined range. Alternatively, the user may have unfettered discretion to select any practical value for the above-indicated pulse aspects. As also shown in FIG. 2, at an optimization settings stage 240, the user, or machine, may also specify or determine certain aspects of the pulse computation procedure, including one or more of the following:

number of iterations of shape optimization;
number of starting shapes for the optimization, with a local iteration being performed to iteratively improve the shape;
objective to be optimized, for example, by setting free parameters in objective functions that weighs EVM and ACPR (or some other parameter or attribute); and
tolerance variables and values such as algorithm convergence settings which determine when the required result is achieved, stop the algorithm after a certain number of steps, and control parameter comparison.

The pulse shapes are characterized by a set of quantities from which the time-domain (or spatial domain) pulse shape is determined. It is these quantities, listed at optimized variables stage 260, that can be iteratively updated during the pulse computation procedure. Example of such updateable parameters include one or more of the following:

"Pulse shape factor," which may be a number between 0 and 1 that is used to form a "smooth" discrete time function that mimics the shape of a bandpass filter spectrum for the band in which the pulse will be used. The higher that number, the closer the middle part of the function is to 1 (but the higher the number, the overall "quality" of its approximation to an ideal bandpass shape will generally suffer).

"Band stretch ratio," which is number $\rho$ between $-1/2$ and $1/2$ which determines the factor $(1+\rho)$ by which the basic spectrum band is stretched $[-w; w] \rightarrow [-(1+\rho)w; (1+\rho)w]$ before a "bandpass" pulse for that specific carrier is computed. In the end all these pulses are aggregated according to the carrier configuration. In some embodiments, the same $\rho$ is used for all channels in order to reduce the dimension of the optimization problem, however a different $\rho$ may be used for each channel.

"Band relative weight factor," which may be a number, f between 1/2 and 3/2 that is used for multi-band configurations to determine how to distribute compensation scale factor between two (or more) bands. Generally, it can be represented by (k−1) numbers where k is the number of channels/bands in multi-band scenario (this factor is generally not required, and does not need to be derived, for single band CFR).

In some embodiments, some parameters or variables may either be optimized through the optimization process of FIG. 2, or may be pre-specified or pre-determined at one of the input stages of the process 200 (e.g., the stages 210, 230, or 240). For example, the hard-clipping factor or the peak qualification window size can either be provided to an optimization stage 250 (implementing an optimization engine), or can be one of the variables/parameters being optimized. The decision as to whether to specify those variables/parameters or compute them via the optimization stage may depend on such factor as the degree of control that a user may wish to have on the shape of the pulses, the added computation complexity to the optimization process if additional variables/parameters are to be optimally determined, etc.

Having provided the communication system data (including configuration of the communication system on which the CFR system is to be implemented, some parameters of the pulse(s) to be used in such a CFR system, optimization settings, and/or the parameters to be optimized), the optimization stage 260, configured to perform a crest-factor reduction parameter optimization process, is run. In some embodiments, the optimization approach may make use of multiple starting points within a specified allowable range of the pulse parameters, and for each starting point the parameters may be iteratively updated to improve the objective function. Evaluation of the objective function makes use of sample input signal (or a repeatedly simulated signal), which is processed by the CFR approach using the pulse shape (and other parameters) being evaluated.

Various objective functions may be used to quantify the quality of a pulse shape. In general, for a particular pulse shape, the achieved EVM and ACPR are determined by processing the input sample with the configured CFR system, or, in some embodiments, a software simulation of the CFR system. In some situations, a linear combination of EVM and ACPR may be used as the objective function. A non-linear combination may be represented as:

$$EVM + \gamma(ACPR - ACPR_{target}) \times ACPR,$$

where $\gamma(t) = k_1 \times t$ if $t > 0$ and $k_2 \times t$ if $t < 0$. Such an objective function may allow the optimization process to primarily reduce ACPR until it reaches a target $ACPR_{target}$, and to then focus on EVM. In a multi-band case, the same pulse shape (suitably scaled in time and weighed based, for example, on the relative power in each of the bands in which the pulse is applied) may be used for each band. In alternative embodiments, different pulse shapes may be used in different bands. Thus, in some embodiments, the optimization stage (optimization engine) may be configured to determine one or more starting-point pulse shapes for the one or more pulses based on the received communication system data and starting point values for the plurality of updateable parameters. With the starting points for the plurality of updateable parameters set, the optimization stage 250 is configured to iteratively update the plurality of updateable parameters based on iterative computation of at least one objective function (which may have been pre-defined, or defined based at least on some input from a user) to provide at least one interim output value derived from application of the crest factor reduction system on a sample input signal using interim one or more pulse shapes determined based on the received communication system data and interim updated values for the plurality of updateable parameters.

An example of an optimization problem to be solved using an objective function such as the above-specified objective function is as follows. Consider a situation in which the following variables are to be optimized:

(1) $x_1$=Pulse shape factor
(2) $x_2$=Band stretch ratio
(3) $x_3$=Bands' relative weight factor
(4) $x_4$=Hard-clipping factor
(5) $x_5$=Qualification window size, where, in this example, $x \in R^5 = \{x_1, x_2, x_3, x_4, x_5\}$, with $x_1 \in [0.1; 0.9]$, $x_2 \in [0.75; 1.25]$, $x_3 \in [0.7; 1.3]$, $x_4 \in [1.00; 1.05]$, and $x_5 \in [0.0; 1.0]$. With these variables to be optimized (e.g., within the specified ranges), the following objective function is to be minimized:

$$\text{minimize}_{(x, PAPR(x) \approx PAPRtarget)} \{EVM(x) + \gamma(ACPR(x) - ACPR_{target}) \times ACPR(x)\},$$

where $\gamma(t)$ is a barrier weight function (piecewise linear function) defined according to $\gamma(t) = k_1 t$ if $t > 0$, and $k_2 t$ if $t \leq 0$, and where $k_1$ and $k_2$ are adjustable coefficients. For instance, $k_1$ can be chosen to be relatively large (e.g., $k_1 = 10$) and $k_2$ may be small (e.g., $k_2 = 0.01$). This choice of coefficients indicates that achieving the target ACPR during optimization is more important than maintaining a low EVM. However, if the target ACPR is exceeded, lowering EVM becomes more important. In some embodiments, minimization of an objective function may be performed based on differentiating the objective function terms/contributions, and using the objective function derivative(s) to identify minima values (corresponding to the values that would minimize the objective function), or to otherwise identify optimum values for the objective function. The minimization may be performed based on such techniques/procedures as conjugate gradients, simplex methods, simulated annealing, genetic algorithms, etc.

The updateable parameters that achieve minimization of the selected objective function are deemed optimal (or near-optimal). These updateable parameters define the pulse shape(s) that is to be subtracted from time domain (or spatial domain) signal representation for a single or multi-band signals, at instances (or locations) of the signals that are based on where a peak of the signal (within some defined window) that exceeds a particular amplitude threshold is identified. In some implementations, a similar optimization process may be applied where a different CFR approach is to be used.

Figure 3:
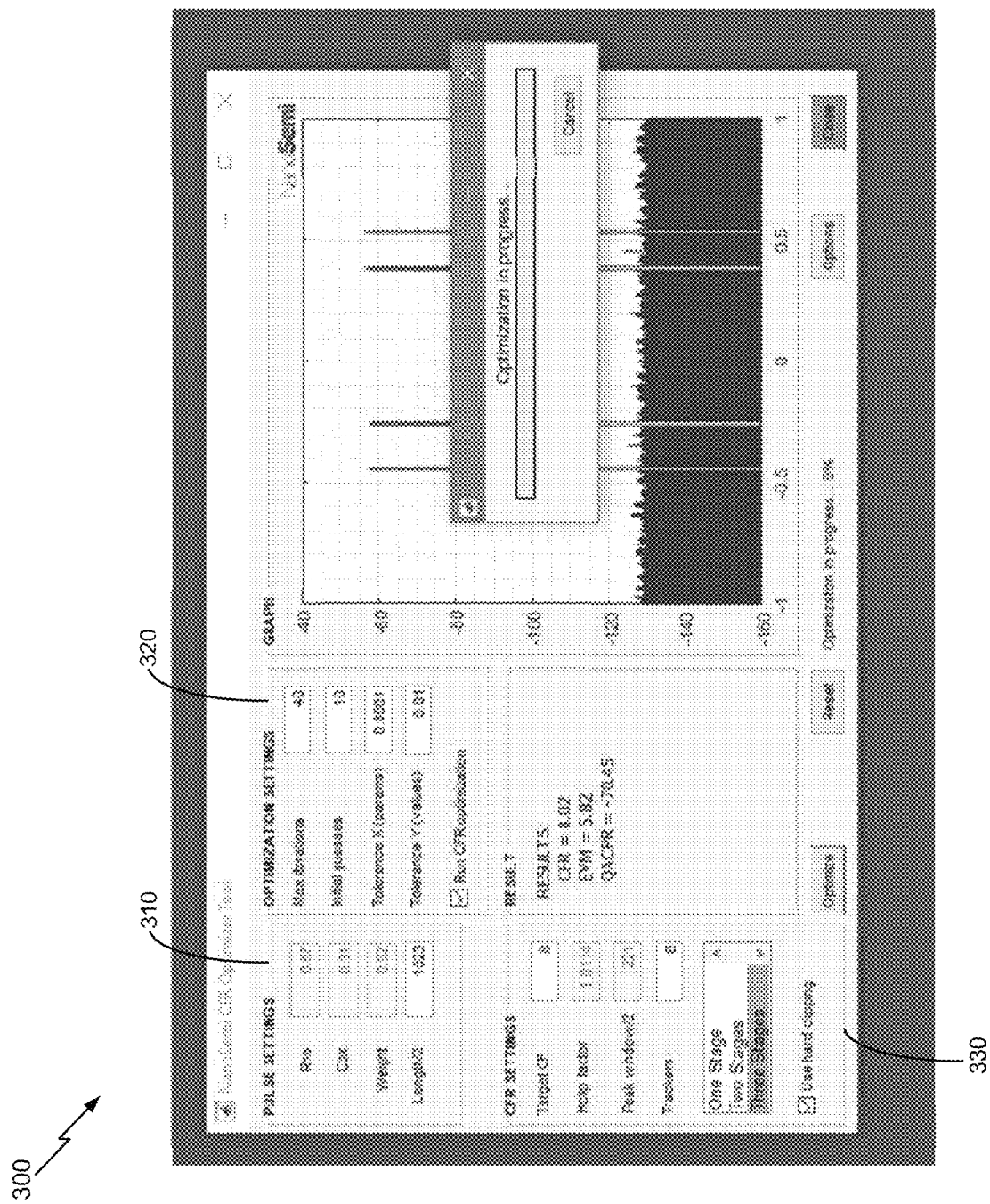
FIG. 3 is a screenshot for an example interface that may be used by a user to provide communication system data.

FIG. 3 is a screenshot for an example interface 300 that may be used by a user to provide communication system data, including the desired pulse shape characteristics to be applied to signal peaks, optimization settings, etc. Thus, as illustrated, the interface includes an interface area 310 in which pulse attributes or settings can be specified, an interface area 320 in which optimization process settings (such as the maximum number of iterations, tolerance values, etc.) may be set, and an interface area 330 in which settings or attributes of the CFR process (e.g., the hard-clip factor, the number of CFR stages, etc.) can be specified. As noted, based on the setting and values specified, optimization of parameters controlling the pulse shape(s) are determined (e.g., parameters that minimize a chosen objective function) to yield optimal pulse shapes for the specified settings and attributes and the given objective function. It is to be noted that more than one objective function may be defined and used in the optimization process. For example, different pulses may be used in different bands (in multi-band embodiments), which may require different objective functions. Alternatively, a single objective function (e.g., a global objective function), to control multiple sets of parameters (each corresponding to a different pulse) may be defined and used to determine optimal or near optimal pulse shapes that are to be applied for the different bands.

The determined parameters, or the pulse representation(s) corresponding thereto, resulting from the optimization process are provided to the device(s) that is to perform the CFR process. For example, the parameters may be communicated to remote devices that use a processor-based devices, and/or dedicated hardware, to implement the CFR process using the optimized updateable parameters determined according to the optimization process. In some embodiments, the optimized parameters may be periodically updated to better match changing system conditions. Alternatively, in some embodiments (e.g., where a generally non-modifiable CFR process is to be implemented using, for example, ASIC hardware or some other hardware that is intended for more permanent, non-changing use), a circuit implementation based on the optimized parameters may be installed at the target device.

As noted, in a pulse-subtraction-based approach, the peak amplitude within some time window is identified, and if that identified peak is above some pre-determined peak amplitude threshold, the cancellation pulse(s) (which, in this case, are the pulses determined according to, for example, the optimization process of FIG. 2) are applied (e.g., subtracted from the signal). In some implementations, the pulse-subtraction CFR approach includes identification of amplitude peaks of in an approximated aggregate time-domain (or spatial domain) signal from the different frequency bands. The aggregate signal from the various bands can be a downsampled approximation (resulting in fewer samples to process or analyze, and thus in a lower use of resources) used to identify the peak (subsequent processing may be performed on higher sampled copies of the signals). The amplitude peak(s) identification may be done for different segments (i.e., the signal may be analyzed to identify amplitude for individual segments), with only one peak, in some embodiments, identified from each segment (even if there are multiple peaks that exceed a pre-determined peak amplitude threshold).

Based on the location of the identified peak in the approximate aggregate signal (e.g., location of the peak in the non-frequency domain representation of the signal), the determined pulses are individually applied to the respective bands (processing of the individual band signals may occur at their normal sampling rate, or at an upsampled or downsampled copy of the signal). For example, respective bandpass filter may be applied to obtain the respective band signals corresponding to the respective bands. In embodiments in which different pulses were determined for different bands, those different pulses are applied to (e.g., subtracted from) the respective bands at time instances (or locations) that are based on the time instance (or location) for the peak identified in the aggregate signal approximation. The particular time instances or locations in the individual bands do not necessarily have to be the same instance of the identified peak, but can be applied according to some formulation that is based on the time instance of location of the identified peak. Accordingly, in some embodiments, a device implementing a pulse-subtraction approach for CFR processing may be configured to identify a peak in an aggregate time-domain (or spatial domain) signal combined from one or more time-domain representations of the received signals in the one or more radio transmission bands, and perform, using the respective determined pulse shapes for the one or more pulses, individual pulse subtraction processing for the respective one or more time-domain representations of the respective received signals at instances of the received signals determined based, at least in part, on a location in the aggregate time-domain (or spatial domain) signal of the identified peak.

In some implementation, the pulse shapes determined during the optimization process (e.g., a process similar to the process 200 of FIG. 2) may be scaled (weighed) according to one or more different criteria. Specifically, because the identification of peaks is performed with respect to an aggregate signal, individual bands with more energy or power than other bands will contribute a higher portion of the energy or power of the aggregate signal. Therefore, more weight should be assigned to pulse shape subtracted from those higher energy bands than the weight assigned to the pulse(s) to be subtracted from the bands with the weaker signals. Thus, in such embodiments, the device configured to perform the individual pulse subtraction may be configured to weigh the respective one or more pulse shapes based on characteristics of the received signals in the one or more bands. The characteristics of the received signals may include at least the relative signal power of the received signals.

Figure 4:
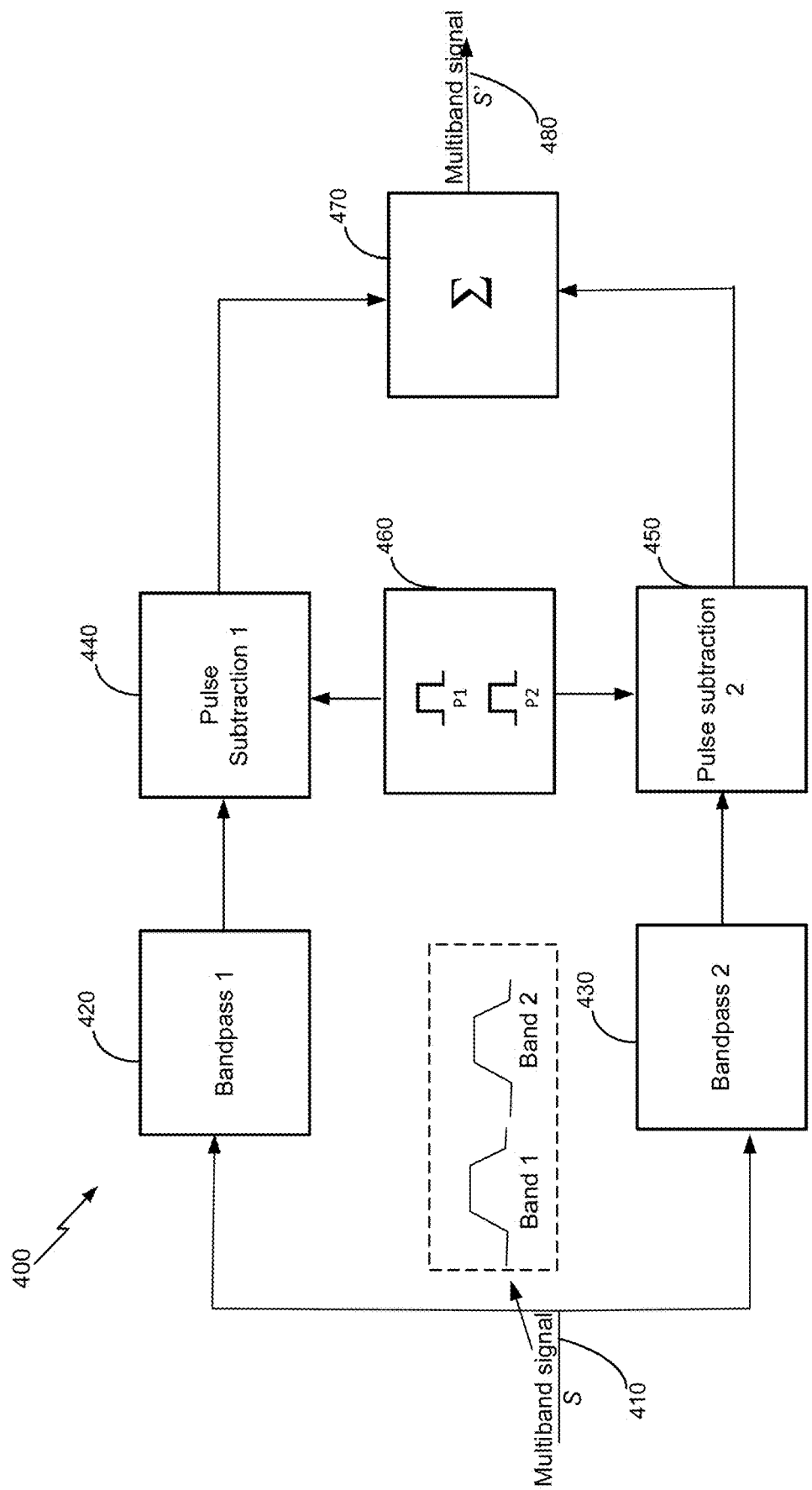
FIG. 4 is a schematic diagram of an example implementation of a circuit to apply pre-determined pulses to separated band signals.

FIG. 4 is a schematic diagram of an example implementation of a circuit 400 to apply pre-determined pulses to separated band signals. The circuit 400 may be implemented at a network node (e.g., the nodes 150a-n or 160a-n of FIG. 1), or at some other type of device (e.g., a mobile device such as the device 110 of FIG. 1). As shown, a multiband signal S (410) is provided to the circuit 400 (in some situations, the signal S may be a single band signal). Bandpass filters 420 and 430, corresponding to the pre-determined bands of the signal 410, are applied to the signal S 410 to obtain the isolated signal bands. Although only two bandpass filters are shown, the circuit 400 may include as many filters as there are bands in the signal S410 that need to be processed. In some implementations, the bandpass operation may also include down sampling operations performed on the input signal to the filters 420 and 430. A pulse generator 460 generates the pulses P1 and P2 (and/or additional pulses, if there are additional bands with respect to which pulse-subtraction-based CFR processing is to be performed), and provides the pulses (which may have already been weighed based, for example, on the relative powers of each of the bands of the signal S 410) to the pulse subtraction circuits 440 and 450. The pulse generator 460 may generate (at run-time, when processing the signal S 410, or previously at some earlier time) the pulses P1 and P2 based on the optimized parameters determined according to, for example, the optimization process 200 of FIG. 2 and/or based on the communication system data provided by a user or from a remote device.

The circuits 440 and 450 are configured to subtract from the filtered band signal the respective pulses provided by the pulse generator 460. In some implementations, the weighing or scaling of the pulses may be performed at the circuits 440 and 450. The pulses received from the pulse generator 460 are applied at instances of the input signals provided to the respective circuits 440 and 450 according to the locations/instances of peaks identified in an aggregate signal comprising the various bands of the signal. That aggregate signal may be an approximation (e.g., down-sampled) of the combined band signals (the peak identification circuit is not shown in FIG. 4).

Subsequent to the individual pulse-subtraction-based CFR processing for each of the band signals, the resultant signals may be combined using a summation circuit 470 to produce the resultant CFR-processed multi-band signal S' 480. It is noted that, in some embodiments, the CFR processing may require several iterations of pulse-subtraction applied to the signals. For example, after producing the resultant multi-band signal S' 480, the signals are processed to again identify peaks in a down-sampled approximation of the signal S' 480, and to apply pulses (which may be the same or different from the pulses P1 and P2 applied at the first iteration of the process) to the band components of the resultant signal S' 480. This process may be repeated until some desired target (e.g., ACPR) is achieved.

The CFR system may be implemented in circuitry that incorporates data storage (configurable and/or read-only storage) of the selected pulse shape(s), (or quantities that permit computation of the pulse shape at runtime). The circuitry may also include dedicated logic (e.g., arithmetic units) and/or a processor or controller for implementing the CFR approach.

As shown, the example device 500 may include a communication module comprising one or more transceivers (e.g., a WLAN transceiver 506, a WWAN transceiver 504, a near-range transceiver 508, etc.) that may be connected to one or more antennas and RF front end modules (illustrated as block 502). The RF front end circuitry of the block 502 may include power amplifiers, LNAs, digital-to-analog converters, analog-to-digital converters, switches and other RF front-end modules, and, in some embodiments, at least some of the RF front end modules may be arranged to realize, at least in part, the runtime and/or design-time CFR system implementations described herein. The transceivers 504, and 506, and/or 508 may comprise suitable devices, hardware, and/or software for communicating with and/or detecting signals to/from a network or remote devices.

The controller/processor 510 may be connected to the transceivers 504, 506, and/or 508, and the one or more sensors 512. The processor may include one or more microprocessors, microcontrollers, and/or digital signal processors that provide processing functions, as well as other computation and control functionality. The device 800 may also include special purpose logic circuitry, e.g., an FPGA (field programmable gate array), an ASIC (application specific-integrated circuit), a DSP processor, a graphics processing unit (GPU), an accelerated processing unit (APU), an application processor, customized dedicated circuitry, etc., to implement, at least in part, the processes and functionality for the device 500. The processor 510 may also include memory 514 (computer accessible storage medium) for storing data and software instructions for executing programmed functionality within the device. Generally speaking, a computer accessible storage medium may include any non-transitory storage media accessible by a computer during use to provide instructions and/or data to the computer. For example, a computer accessible storage medium may include storage media such as magnetic or optical disks and semiconductor (solid-state) memories, DRAM, SRAM, etc. The memory 514 may be on-board the processor 510 (e.g., within the same IC package), and/or the memory may be external memory to the processor and coupled thereto over a data bus.

The device 500 may be configured to (e.g., via hardware resident in the device and/or software modules/applications provided on the memory 514) to implement CFR-related procedures (design-time and/or runtime CFR processing), including implementation of the procedures according to those described below in relation to FIGS. 6 and 7. Thus, the device 500 may thus be configured (via software modules/applications provided on the memory 514) to implement, for example, a process to optimize parameters that control pulse shapes used in CFR procedure, including a process to receive communication system data representative of characteristics of a communication system, optimize a plurality of updateable parameters that determine respective pulse shapes for one or more pulses for use in a crest factor reduction system, and provide the optimized plurality of updateable parameters to configure the crest reduction system for use in processing signals for radio transmission using a pulse subtraction approach. Another process that may be implemented using the processor 510 (and/or using a special-purpose circuitry) may include be a process to identify a peak (e.g., using a peak identification circuit) in an aggregate time-domain signal combined from one or more time-domain representations of received signals in one or more radio transmission bands, and perform, using respective pulse shapes for the one or more pulses determined based on a plurality of optimized updateable parameters, individual pulse subtraction processing for the respective one or more time-domain representations of the respective received signals at instances of the received signals determined based, at least in part, on a location in the aggregate time-domain signal of the identified peak. Optimization of the plurality of updateable parameters may be based on an earlier performance of iterative updating of the plurality of updateable parameters according to iterative evaluation of a plurality of performance parameters.

Figure 5:
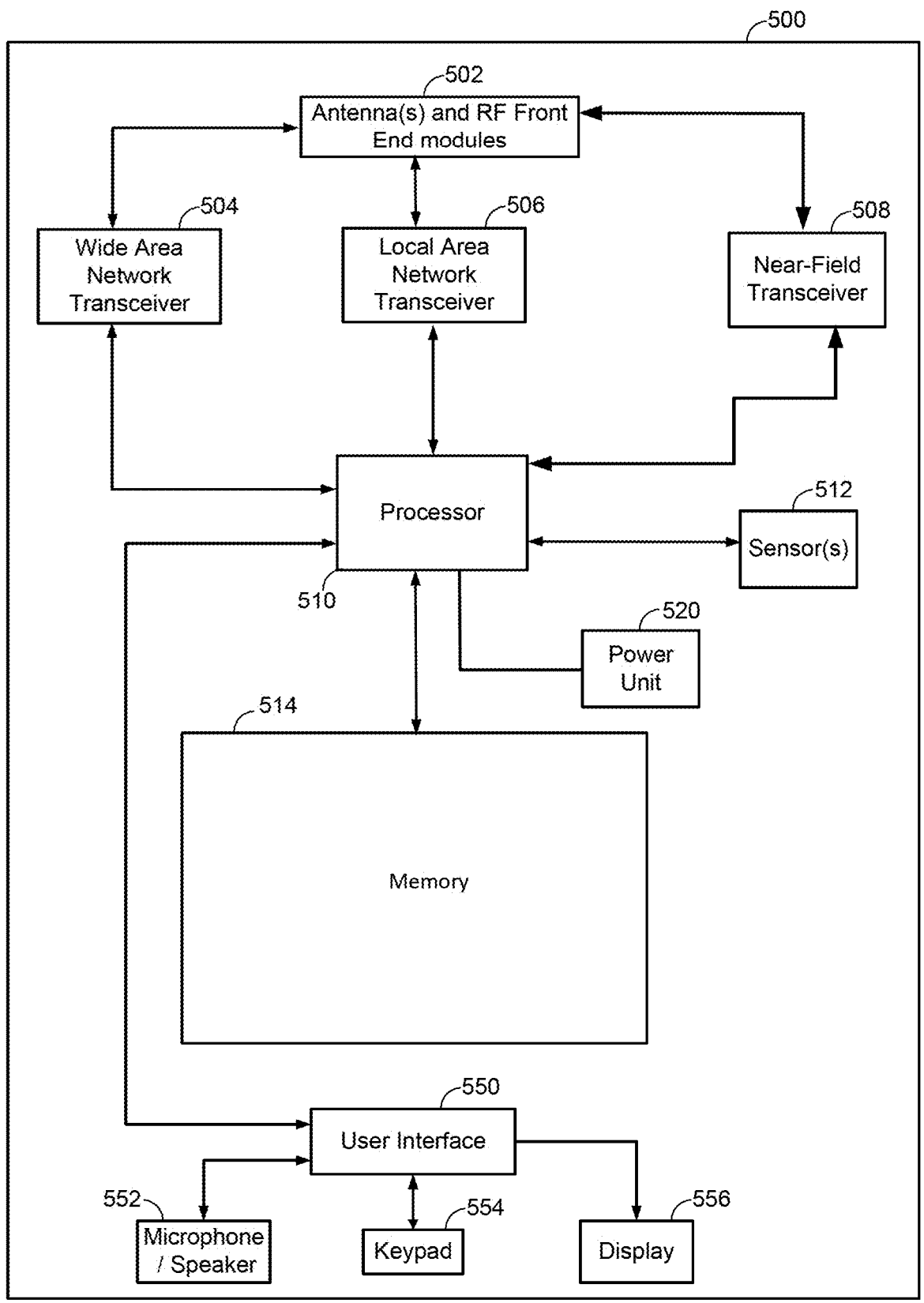
FIG. 5 is a schematic diagram of an example device which may be used in the implementation of any of the devices of FIG. 1.

The example device 500 may further include a user interface 550 which provides any suitable interface systems, such as a microphone/speaker 552, keypad or touchscreen 554 (or some other user-interface input mechanism), and display 556 that allows user interaction with the device 500. Such a user interface, be it an audiovisual interface (e.g., a display and speakers), or some other type of interface (visual-only, audio-only, tactile, etc.), configured to provide status data, alert data, and so on, to a user using the device 500. The microphone/speaker 552 provides for voice communication functionality, and may also include or be coupled to a speech synthesizer (e.g., a text-to-speech module) that can convert text data to audio speech so that the user can receive audio notifications. Such a speech synthesizer may be a separate module, or may be integrally coupled to the microphone/speaker 552 or to the processor 510 of the device of FIG. 5. The keypad 554 includes suitable buttons for user input. The display 556 includes any suitable display, such as, for example, a backlit LCD display, and may further include a touch screen display for additional user input modes. The device 500 may further include a power unit 520 such as one or more batteries and/or a power conversion module that receives and regulates power from an outside source (e.g., AC power).

The above implementations, as illustrated in FIGS. 1-5, are applicable to a wide range of technologies that include RF technologies (including WWAN technologies, such as cellular technologies, and WLAN technologies), satellite communication technologies, cable modem technologies, wired network technologies, optical communication technologies, and all other RF and non-RF communication technologies. The implementations described herein encompass all techniques and embodiments that pertain to use of multiband digital predistortion in various different communication systems.

In some implementations, a computer accessible non-transitory storage medium includes a database (also referred to a "design structure" or "integrated circuit definition dataset") representative of a system including some or all of the components of the CFR implementations described herein. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates which also represents the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, the database may itself be the netlist (with or without the synthesis library) or the data set.

Figure 6:
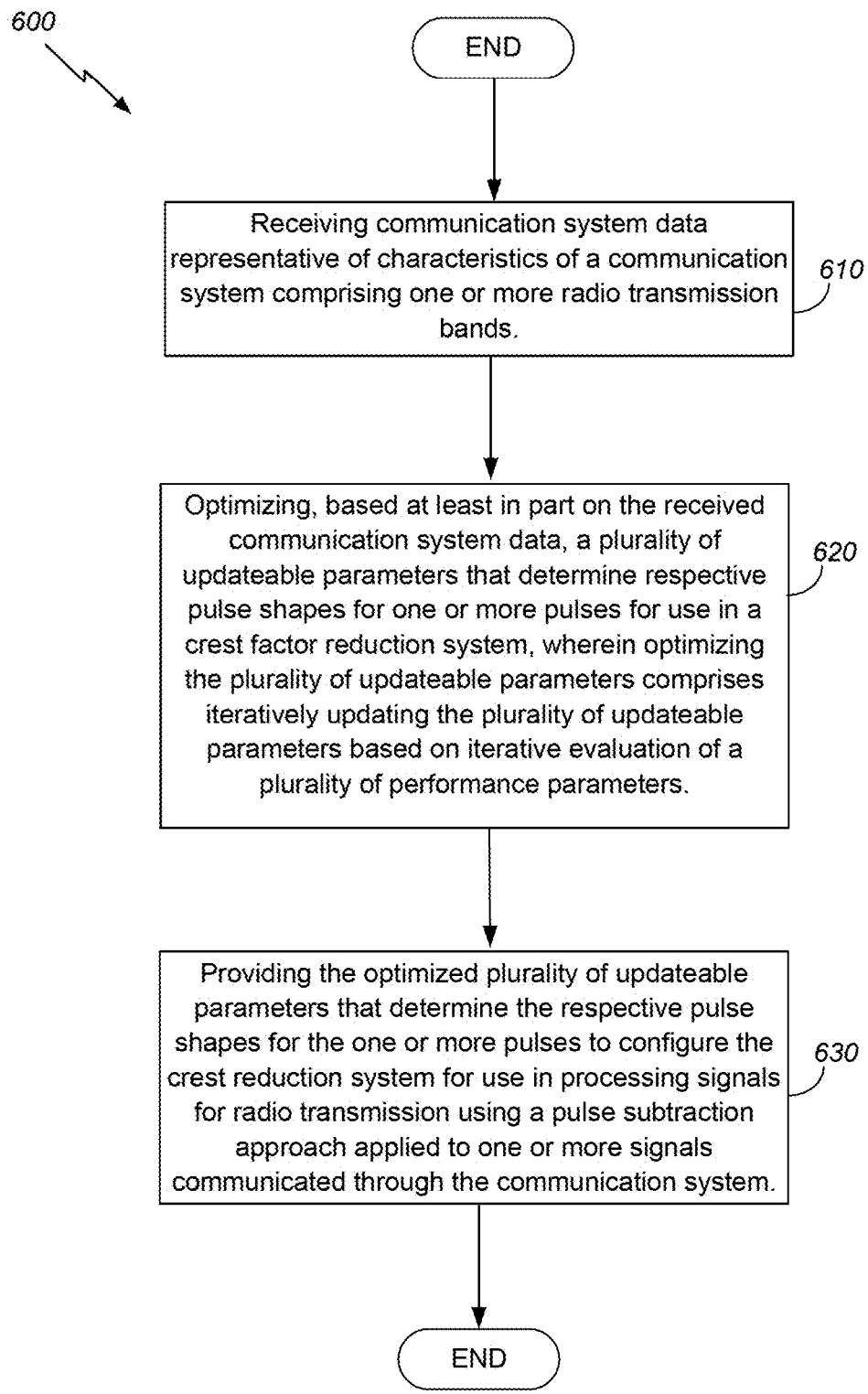
FIG. 6 is a flowchart of an example procedure to facilitate implementation of CFR processing.

With reference now to FIG. 6, a flowchart of an example procedure 600 to facilitate implementation of CFR processing, which may be performed at a different device than a target device on which the CFR processing is run, is shown. The procedure 600 includes receiving 610 communication system data representative of characteristics of a communication system comprising one or more radio transmission bands. The communication system data may include data representative of network characteristics, some attributes of the pulse shape to be optimized (e.g., so that there are fewer variables to optimize), optimization setting, etc. Thus, receiving the communication system data may include receiving one or more of, for example, an adjacent power value ratio (ACPR), an up-sampling value, a sampling rate, carrier configuration data, a pulse shape factor value, a band stretch ratio, at least one pulse band weight, a hard-clipping factor, a pulse length value, a number of peak trackers, a number of crest factor reduction stages, and/or a qualification window size value representative of a smallest time separation between cancelled peaks.

With continued reference to FIG. 6, the procedure 600 further includes optimizing 620, based at least in part on the received communication system data, a plurality of updateable parameters that determine (control) respective pulse shapes for one or more pulses for use in a crest factor reduction system, with optimizing the plurality of updateable parameters including iteratively updating the plurality of updateable parameters based on iterative evaluation of a plurality of performance parameters. Optimizing the plurality of the updateable parameters may include optimizing one or more of, for example, a pulse shape factor to control signal smoothing level, a band stretch ratio, a band relative weight factor to control distribution of a compensation scale factor between the one or more radio transmission bands, a hard clipping factor, and/or a qualification window size value representative of a smallest time separation between cancelled peaks.

In some embodiments, iteratively updating the plurality of updateable parameters based on iterative evaluation of the plurality of performance parameters may include defining at least one objective function representative of quality of the respective pulse shapes for the one or more pulses, determining one or more starting-point pulse shapes for the one or more pulses based on the received communication system data and starting point values for the plurality of updateable parameters, and iteratively updating the plurality of updateable parameters based on iterative computation of the at least one objective function to provide at least one interim output value derived from application of the crest factor reduction system on a sample input signal using interim one or more pulse shapes determined based on the received communication system data and interim updated values for the plurality of updateable parameters. Defining the at least one objective function may include defining an objective function comprising a linear combination of an error vector magnitude (EVM) and an adjacent channel power ratio (ACPR) according to $EVM+\gamma(ACPR-ACPR_{target})\times ACPR$, where $\gamma$ is a barrier weight function $\gamma(t)$ computed according to $\gamma(t)=k_1 \times t$ if $t>0$ or $\gamma(t)=k_2 \times t$ if $t<0$, where $k_1$ and $k_2$ are adjustable coefficients and where $ACPR_{target}$ is representative of a pre-determined target ACPR value.

The procedure 600 additionally includes providing 630 the optimized plurality of updateable parameters that determine the respective pulse shapes for the one or more pulses to configure the crest reduction system for use in processing signals for radio transmission using a pulse subtraction approach applied to one or more signals communicated through the communication system.

Having determined the optimized updateable parameter, the procedure 600 may also include, in some implementations, configuring the crest reduction system with the optimized values, and processing received signals for transmission using the crest factor reduction system. The configuring and processing may be performed on the same device that also performed the optimization process (e.g., the operations 610-630 of the FIG. 6). In such embodiments, a device may be configured to determine the optimized parameters (to control the pulse shape it produces) locally. Alternatively, in some embodiments, the optimized parameters are provided to a remote device/machine (i.e., the CFR design stage is performed remotely from where the run-time stage is performed). Processing the received signals may include performing pulse subtraction processing on the received signals using the respective one or more pulse shapes determined, at least in part, based on the optimized plurality of updateable parameters. Performing the pulse subtraction processing on the received signals may include identifying a peak in an aggregate time-domain signal combined from one or more time-domain representations of the received signals in the one or more radio transmission bands, and performing, using the respective determined pulse shapes for the one or more pulses, individual pulse subtraction processing for the respective one or more time-domain representations of the respective received signals at instances of the received signals determined based, at least in part, on a location in the aggregate time-domain signal of the identified peak. Performing the individual pulse subtraction may include weighing the respective one or more pulse shapes based on characteristics of the received signals in the one or more bands. The characteristics of the received signals may include at least relative signal power of the received signals.

Figure 7:
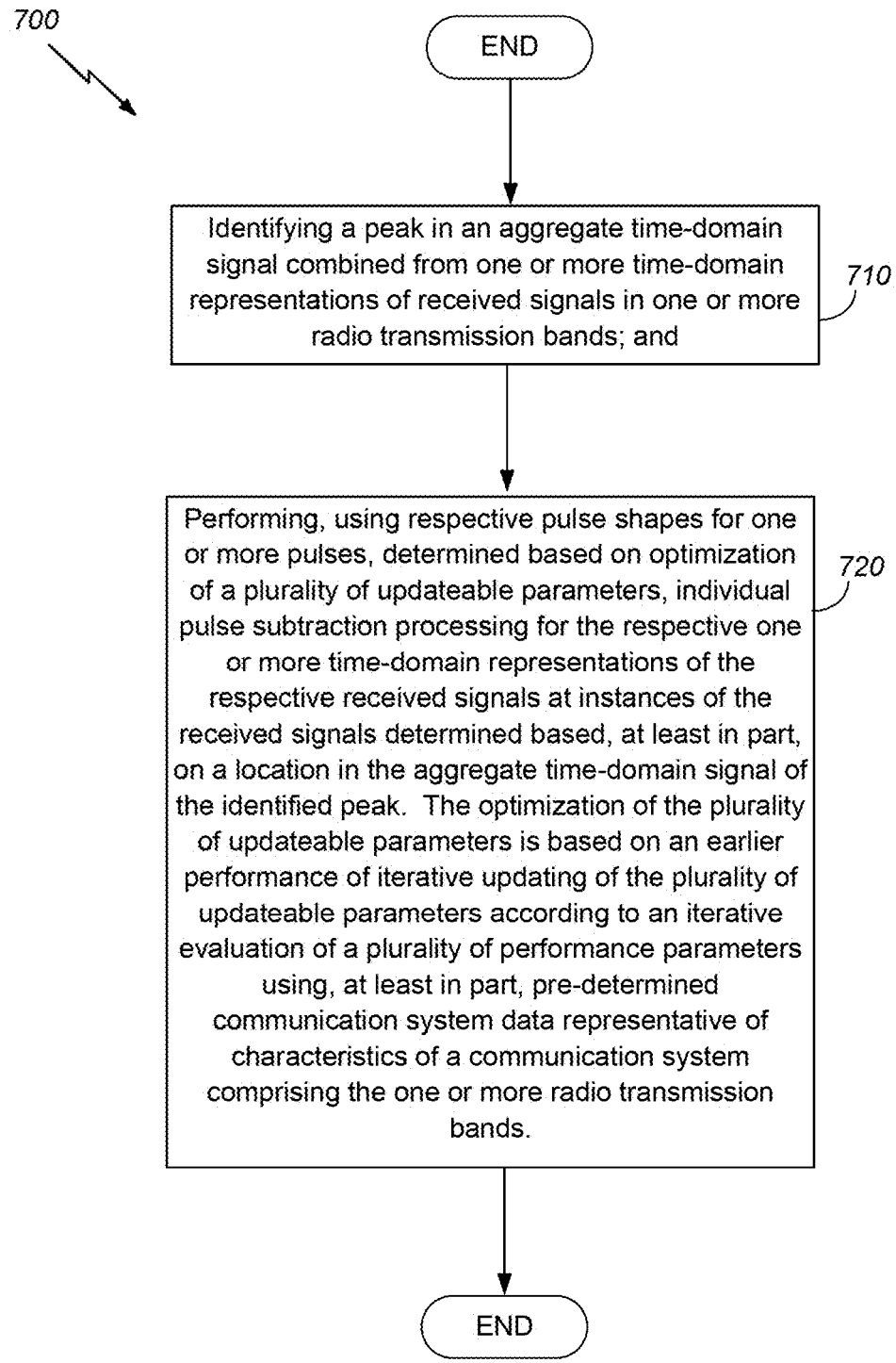
FIG. 7 is a flowchart of an example procedure to perform CFR processing.

With reference next to FIG. 7, a flowchart of an example procedure 700 to perform signal processing in a crest factor reduction system is shown. The procedure 700 may be performed at any device (e.g., a personal device, or a wireless network node that manages traffic to and from multiple devices) configured to perform crest factor reduction processing, and may include devices that also perform the design stage processing (to determine optimized parameters that control the pulse shapes of the pulses subtracted from signals to implement CFR), or that receive (e.g., from a remote device or during installation) data or hardware to allow it to perform CFR processing. Thus, the procedure 700 includes identifying 710 a peak in an aggregate time-domain (or another non-frequency domain, e.g., spatial domain) signal combined from one or more time-domain representations of received signals in one or more radio transmission bands.

The procedure 700 further includes performing 720, using respective pulse shapes for one or more pulses, determined based on optimization of a plurality of updateable parameters, individual pulse subtraction processing for the respective one or more time-domain representations of the respective received signals at instances of the received signals determined based, at least in part, on a location in the aggregate time-domain signal of the identified peak. The optimization of the plurality of updateable parameters is based on an earlier performance of iterative updating of the plurality of updateable parameters according to an iterative evaluation of a plurality of performance parameters using, at least in part, pre-determined communication system data representative of characteristics of a communication system comprising the one or more radio transmission bands. In some embodiments, performing the individual pulse subtraction processing may include weighing the respective one or more pulse shapes based on characteristics of the received signals in the one or more radio transmission bands. The characteristics of the received signals may include at least relative signal power of the received signals. As noted, the optimization of the plurality of updateable parameters may include optimization of one or more of, for example, a pulse shape factor to control signal smoothing level, a band stretch ratio, a band relative weight factor to control distribution of a compensation scale factor between the one or more radio transmission bands, a hard clipping factor, and/or a qualification window size value representative of a smallest time separation between cancelled peaks.

In some implementations, during the optimization process (to determine optimal or near-optimal pulse shapes) the iterative updating of the plurality of updateable parameters according to the iterative evaluation of the plurality of performance parameters may be performed using at least one objective function representative of quality of the respective pulse shapes for the one or more pulses and iterative updating of the plurality of updateable parameters according to iterative computation of the at least one objective function to provide at least one interim output value derived from application of the crest factor reduction system on a sample input signal using interim one or more pulse shapes, with the interim one or more pulse shapes determined based on the communication system data and interim updated values for the plurality of updateable parameters. The objective function used may be similar to any of the objective functions discussed herein.

Unless defined otherwise, all technical and scientific terms used herein have the same meaning as commonly or conventionally understood. As used herein, the articles "a" and "an" refer to one or to more than one (i.e., to at least one)

of the grammatical object of the article. By way of example, "an element" means one element or more than one element. "About" and/or "approximately" as used herein when referring to a measurable value such as an amount, a temporal duration, and the like, encompasses variations of +20% or +10%, +5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of +20% or +10%, +5%, or +0.1% from the specified value, as such variations are appropriate in the context of the systems, devices, circuits, methods, and other implementations described herein.

As used herein, including in the claims, "or" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

Although particular embodiments have been disclosed herein in detail, this has been done by way of example for purposes of illustration only, and is not intended to be limit the scope of the invention, which is defined by the scope of the appended claims. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

What is claimed is:

1. A method comprising:
    receiving pre-specified communication system data representative of characteristics of a communication system comprising one or more radio transmission bands;
    optimizing, based at least in part on the received pre-specified communication system data, a plurality of updateable parameters that determine respective pulse shapes for one or more pulses for use in a crest factor reduction system, including updating the plurality of updateable parameters based on evaluation of a plurality of distortion measures; and
    providing the optimized plurality of updateable parameters that determine the respective pulse shapes for the one or more pulses to configure the crest factor reduction system for use in processing later received signals for radio transmission using a pulse subtraction approach applied to the later signals communicated through the communication system.

2. The method of claim 1, wherein optimizing the plurality of the updateable parameters comprises:
    optimizing one or more of: a pulse shape factor to control signal smoothing level, a band stretch ratio, a band relative weight factor to control distribution of a compensation scale factor between the one or more radio transmission bands, a hard clipping factor, or a qualification window size value representative of a smallest time separation between cancelled peaks.

3. The method of claim 1, wherein receiving the pre-specified communication system data comprises:
    receiving one or more of: an adjacent power value ratio (ACPR), an up-sampling value, a sampling rate, carrier configuration data, a pulse shape factor value, a band stretch ratio, at least one pulse band weight, a hard-clipping factor, a pulse length value, a number of peak trackers, a number of crest factor reduction stages, or a qualification window size value representative of a smallest time separation between cancelled peaks.

4. The method of claim 1, wherein updating the plurality of updateable parameters based on the evaluation of the plurality of distortion measures comprises:
    defining at least one objective function representative of quality of the respective pulse shapes for the one or more pulses;
    determining one or more starting-point pulse shapes for the one or more pulses based on the received pre-specified communication system data and starting point values for the plurality of updateable parameters; and
    iteratively updating the plurality of updateable parameters based on iterative computation of the at least one objective function to provide at least one interim output value derived from application of the crest factor reduction system on a sample input signal using interim one or more pulse shapes, with the interim one or more pulse shapes determined based on the received pre-specified communication system data and interim updated values for the plurality of updateable parameters.

5. The method of claim 4, wherein defining the at least one objective function comprises:
    defining an objective function comprising a linear combination of an error vector magnitude (EVM) and an adjacent channel power ratio (ACPR) according to:

$$EVM + \gamma(ACPR - ACPR_{target}) \times ACPR,$$

where $\gamma$ is a barrier weight function $\gamma(t)$ computed according to $\gamma(t) = k_1 \times t$ if $t > 0$ or $\gamma(t) = k_2 \times t$ if $t < 0$, where $k_1$ and $k_2$ are adjustable coefficients and where $ACPR_{target}$ is representative of a pre-determined target ACPR value.

6. The method of claim 1, further comprising:
    configuring the crest factor reduction system with the optimized plurality of updateable parameters; and
    processing the later received signals for transmission using the crest factor reduction system.

7. The method of claim 6, wherein processing the later received signals comprises:
    performing pulse subtraction processing on the received signals using the respective one or more pulse shapes determined, at least in part, based on the optimized plurality of updateable parameters.

8. The method of claim 7, wherein performing the pulse subtraction on the later received signals comprises:
    identifying a peak in an aggregate time-domain signal combined from one or more time-domain representations of the later received signals in the one or more radio transmission bands; and
    performing, using the respective determined pulse shapes for the one or more pulses, individual pulse subtraction processing for the respective one or more time-domain representations of the respective later received signals at instances of the later received signals determined based, at least in part, on a location in the aggregate time-domain signal of the identified peak.

9. The method of claim 8, wherein performing the individual pulse subtraction processing comprises:

weighing the respective one or more pulse shapes based on characteristics of the later received signals in the one or more bands.

10. The method of claim 9, wherein the characteristics of the received signals comprise at least relative signal power of the later received signals.

11. A system comprising:
an interface to receive pre-specified communication system data representative of characteristics of a communication system comprising one or more radio transmission bands;
an optimization engine configured to optimize, based at least in part on the received pre-specified communication system data, a plurality of updateable parameters that determine respective pulse shapes for one or more pulses for use in a crest factor reduction system, including updating the plurality of updateable parameters based on evaluation of a plurality of distortion measures; and
a communication module to provide the optimized plurality of updateable parameters that determine the respective pulse shapes for the one or more pulses to configure the crest factor reduction system for use in processing later received signals for radio transmission using a pulse subtraction approach applied to the later received signals communicated through the communication system.

12. The system of claim 11, wherein the optimizer configured to optimize the plurality of the updateable parameters is configured to:
optimize one or more of: a pulse shape factor to control signal smoothing level, a band stretch ratio, a band relative weight factor to control distribution of a compensation scale factor between the one or more radio transmission bands, a hard clipping factor, or a qualification window size value representative of a smallest time separation between cancelled peaks.

13. The system of claim 11, wherein the optimizer configured to update the plurality of updateable parameters based on the evaluation of the plurality of distortion measures is configured to:
define at least one objective function representative of quality of the respective pulse shapes for the one or more pulses;
determine one or more starting-point pulse shapes for the one or more pulses based on the received communication system data and starting point values for the plurality of updateable parameters; and
iteratively update the plurality of updateable parameters based on iterative computation of the at least one objective function to provide at least one interim output value derived from application of the crest factor reduction system on a sample input signal using interim one or more pulse shapes, with the interim one or more pulse shapes determined based on the received communication system data and interim updated values for the plurality of updateable parameters.

14. The system of claim 13, wherein the optimizer configured to define the at least one objective function is configured to:
define an objective function comprising a linear combination of an error vector magnitude (EVM) and an adjacent channel power ratio (ACPR) according to:

$$EVM + \gamma(ACPR - ACPR_{target}) \times ACPR,$$

where $\gamma$ is a barrier weight function $\gamma(t)$ computed according to $\gamma(t) = k_1 \times t$ if $t > 0$ or $\gamma(t) = k_2 \times t$ if $t < 0$, where $k_1$ and $k_2$ are adjustable coefficients and where $ACPR_{target}$ is representative of a pre-determined target ACPR value.

15. The system of claim 11, further configured to:
configure the crest factor reduction system with the optimized plurality of updateable parameters; and
process the later received signals for transmission using the crest factor reduction system.

16. A method for signal processing in a crest factor reduction system, the method comprising:
identifying a peak in an aggregate time-domain signal combined from one or more time-domain representations of received signals in one or more radio transmission bands; and
performing, using respective pulse shapes for one or more pulses, determined based on optimization of a plurality of updateable parameters, individual pulse subtraction processing for the respective one or more time-domain representations of the respective received signals at instances of the received signals determined based, at least in part, on a location in the aggregate time-domain signal of the identified peak, wherein the optimization of the plurality of updateable parameters is based on an earlier performance of iterative updating of the plurality of updateable parameters according to an iterative evaluation of a plurality of performance parameters using, at least in part, pre-determined communication system data representative of characteristics of a communication system comprising the one or more radio transmission bands.

17. The method of claim 16, wherein performing the individual pulse subtraction processing comprises:
weighing the respective one or more pulse shapes based on characteristics of the received signals in the one or more radio transmission bands.

18. The method of claim 17, wherein the characteristics of the received signals comprise at least relative signal power of the received signals.

19. The method of claim 16, wherein the optimization of the plurality of updateable parameters comprises optimization of one or more of: a pulse shape factor to control signal smoothing level, a band stretch ratio, a band relative weight factor to control distribution of a compensation scale factor between the one or more radio transmission bands, a hard clipping factor, or a qualification window size value representative of a smallest time separation between cancelled peaks.

20. The method of claim 16, wherein the pre-specified communication system data comprises one or more of: an adjacent power value ratio (ACPR), an up-sampling value, a sampling rate, carrier configuration data, a pulse shape factor value, a band stretch ratio, at least one pulse band weight, a hard-clipping factor, a pulse length value, a number of peak trackers, a number of crest factor reduction stages, or a qualification window size value representative of a smallest time separation between cancelled peaks.

21. The method of claim 16, wherein the updating of the plurality of updateable parameters according to the evaluation of the plurality of distortion measures is performed using at least one objective function representative of quality of the respective pulse shapes for the one or more pulses and iterative updating of the plurality of updateable parameters according to iterative computation of the at least one objective function to provide at least one interim output value derived from application of the crest factor reduction system on a sample input signal using interim one or more pulse shapes, with the interim one or more pulse shapes determined based on the pre-specified communication system data and interim updated values for the plurality of updateable parameters.

22. The method of claim 21, wherein the at least one objective function comprises a linear combination of an error vector magnitude (EVM) and an adjacent channel power ratio (ACPR) according to:

$$EVM+\gamma(ACPR-ACPR_{target})\times ACPR,$$

where $\gamma$ is a barrier weight function $\gamma(t)$ computed according to $\gamma(t)=k_1\times t$ if $t>0$ or $\gamma(t)=k_2\times t$ if $t<0$, where $k_1$ and $k_2$ are adjustable coefficients and where $ACPR_{target}$ is representative of a pre-determined target ACPR value.

23. A crest factor reduction system comprising:
a peak identification circuit to identify a peak in an aggregate time-domain signal combined from one or more time-domain representations of received signals in one or more radio transmission bands; and
a pulse subtraction circuit to perform, using respective pulse shapes for one or more pulses, determined based on optimization of a plurality of updateable parameters, individual pulse subtraction processing for the respective one or more time-domain representations of the respective received signals at instances of the received signals determined based, at least in part, on a location in the aggregate time-domain signal of the identified peak, wherein the optimization of the plurality of updateable parameters is based on an earlier performance of updating of the plurality of updateable parameters according to an evaluation of a plurality of distortion measures using, at least in part, pre-specified communication system data representative of characteristics of a communication system comprising the one or more radio transmission bands.

24. The system of claim 23, wherein the circuit subtraction circuit to perform the individual pulse subtraction processing is configured to:
weigh the respective one or more pulse shapes based on characteristics of the received signals in the one or more radio transmission bands.

25. The system of claim 24, wherein the characteristics of the received signals comprise at least relative signal power of the received signals.

26. The system of claim 23, wherein the optimization of the plurality of updateable parameters comprises optimization of one or more of: a pulse shape factor to control signal smoothing level, a band stretch ratio, a band relative weight factor to control distribution of a compensation scale factor between the one or more radio transmission bands, a hard clipping factor, or a qualification window size value representative of a smallest time separation between cancelled peaks.

27. A design structure encoded on a non-transitory machine-readable medium, said design structure comprising elements that, when processed in a computer-aided design system, generate a machine-executable representation of the crest factor reduction system of claim 23.

28. The method of claim 1, wherein optimizing the plurality of updateable parameters comprises:
deriving the plurality of updateable parameters based on optimization of an objective function defined based on a combination of the plurality of distortion measures that includes a distortion measure that depends on a characteristic outside a desired signal band, and a distortion measure that depends on a characteristic inside the desired signal band, with the optimization performed according to the received pre-specified communication system data.

\* \* \* \* \*